(12) United States Patent
Wang

(10) Patent No.: US 7,210,080 B2
(45) Date of Patent: Apr. 24, 2007

(54) METHOD FOR TESTING CHIP CONFIGURATION SETTINGS

(75) Inventor: Jing-Rung Wang, Taipei (TW)

(73) Assignee: Via Technologies, Inc., Taipei (TW)

( * ) Notice: Subject to any disclaimer, the term of this patent is extended or adjusted under 35 U.S.C. 154(b) by 521 days.

(21) Appl. No.: 10/609,387

(22) Filed: Jul. 1, 2003

(65) Prior Publication Data

US 2004/0024556 A1 Feb. 5, 2004

(30) Foreign Application Priority Data

Jul. 24, 2002 (TW) ................................ 091116414

(51) Int. Cl.
*G01R 31/28* (2006.01)
*G06F 17/50* (2006.01)
(52) U.S. Cl. ......................................... 714/724; 716/8
(58) Field of Classification Search ................ 714/736, 714/724, 733, 30, 36; 716/4, 8
See application file for complete search history.

(56) References Cited

U.S. PATENT DOCUMENTS

| | | | | |
|---|---|---|---|---|
| 4,907,230 A | * | 3/1990 | Heller et al. ................. | 714/724 |
| 5,369,647 A | * | 11/1994 | Kreifels et al. ............. | 714/736 |
| 5,410,551 A | * | 4/1995 | Edwards et al. ............. | 714/736 |
| 5,634,137 A | * | 5/1997 | Merkin et al. ................. | 710/10 |
| 6,158,000 A | * | 12/2000 | Collins ........................... | 713/1 |
| 6,601,200 B1 | * | 7/2003 | Delp et al. ................... | 714/724 |
| 6,825,682 B2 | * | 11/2004 | Kantz et al. ................. | 324/763 |
| 6,971,048 B1 | * | 11/2005 | Hanson et al. ................. | 714/41 |

OTHER PUBLICATIONS

"Configuration Self-Test in FPGA-based Reconfigurable Systems" by Quddus et al. IEEE International Symposium on Circuits and Systems, 1999. Publication Date: Jul. 1999 vol. 1, pp. 97-100 ISBN: 0-7803-5471-0 INSPEC Accession No. 6382155.*

* cited by examiner

*Primary Examiner*—Cynthia Britt
(74) *Attorney, Agent, or Firm*—Rosenberg, Klein & Lee

(57) ABSTRACT

The present invention relates to a method for testing a chip, particularly to a method for testing chip configuration settings, essentially installing the chip on a main board after the chip fabrication is finished. The test comprises starting power first of all, a power on self test being performed by the system; loading a BIOS program, wherein the BIOS program includes a configuration test process; testing the configuration settings of the chip by the configuration test process; inputting test data in turn; then enabling registers corresponding to the chip configuration space depending on the test data, for starting the chip operation; obtaining the data, produced by the chip operation, to be compared with an expected result, in order for performing the verification of chip configuration settings at the final stage before the actual chip operation is started, so as to speed the development and modification for the chip.

12 Claims, 4 Drawing Sheets

METHOD FOR TESTING CHIP CONFIGURATION SETTINGS

FIELD OF THE INVENTION

The present invention relates to a method for testing a chip, more particularly to a method for testing chip configuration settings, essentially adding a test process for the chip configuration settings into a BIOS program to perform the verification of configuration in the actual working environment as well as at the final stage before the operation is started.

BACKGROUND

Recently, the high development in information related industry and the trend in pursuit of speed, a variety of electronic and information products have been presented, and the existing products have also been reconditioned or renewed, for dazzling men. For the industry, it is unavoidable to perform various tests on samples with different specifications to verify whether the operation of the design is correct or not. Therefore, the quality control and test for several products has become a significant issue in industry.

In the past, the development process, from design, through manufacture, and up to verification, for a new type of product performed by chip designers and manufactures is essentially shown as FIG. 1. First, the design for the chip is completed 101. The completed chip design is then tested under the simulation environment to check whether the chip design will react properly on various commands 103. Only after having been confirmed, is engineering sample production for the chip 105 allowed. After fabrication of the chip, for the purpose of performance testing, it is then necessary to prepare a corresponding main board for supporting the chip 107, to assemble a computer including the chip therein 109, install the operating system of the computer and software used for testing 111, and finally to perform an on-board test and analysis for the chip 113. The chip may be put into market formally in the event of passing the test; otherwise, a modification to the chip design is necessary.

In general, most errors in the logical circuit of the product design may be found and then corrected after the simulation verification process and a series of tests in the process 101, have been completed. However, with the chip installed on the main board, there are possibly still some potential errors that may occur at the regular operation, such as a wrong setting with respect to the configuration space, and the like, etc.

In the conventional art, the completed chip is first installed on the main board and the power on self test (POST) runs. Subsequently, the basic input/output system (BIOS) is loaded and then the chip is initialized. After the data and initial values of the chip setting in the chip configuration space have been read, the operating system is loaded for normal start.

During the aforementioned start process, the chip is initialized without verifying its configuration settings. At this moment, the operation of the chip may be different from the presetting target, resulting in abnormal operation, in the event of that wrong configuration setting of the chip occurs.

Moreover, the initial values may be set under the assumption that the configuration space settings of the chip are correct. It is hard to trace the source problem once the chip experiences problem due to the wrong configuration setting. As a result, repeated and complex precision testing is necessary for finding out where the key problem is. Therefore, a waste of time and labor, increased manufacturing cost, reduced product competition, and resistance for the development of new generation products may be encountered.

Thus, what is desired by users and intended to be solved by the present invention for a long time is proposing a novel solution, designing a test method with high efficiency for not only testing the configuration setting of the chip, but also testing before the chip is placed on the main board for operating actually, in order to examine the actual operation of the chip, aiming at the disadvantages in the manufacture and test process for the aforementioned conventional chip. Actual experiences, in related research, development, and sale, in the information industry are the basis of the present invention for the improvement. With several designs, studies, samples, and improvements, a method for testing chip configuration settings is thus invented for solving above problems.

SUMMARY OF THE INVENTION

Accordingly, it is a primary object of the present invention to provide a method for testing chip configuration settings, essentially adding a configuration test process into a BIOS program to examine the actual effect of the configuration settings on the chip operation after the chip to be tested is installed on a main board.

It is a secondary object of the present invention to provide a method for testing chip configuration settings, wherein a test data table list is provided in the configuration test process for inputting to be tested.

It is another object of the present invention to provide a method for testing chip configuration settings, wherein an expected result data table list is provided in the configuration test process to be compared with an output result.

It is another object of the present invention to provide a method for testing chip configuration settings, wherein the configuration test process further comprises a step of recording a comparison result to be a reference served for correcting and developing the chip configuration.

The features, steps, and the effects to be achieved may further be understood and appreciated by reference to the following detailed description of the presently preferred embodiments together with the accompanying drawings, in which:

DETAILED DESCRIPTION

Figure 1:
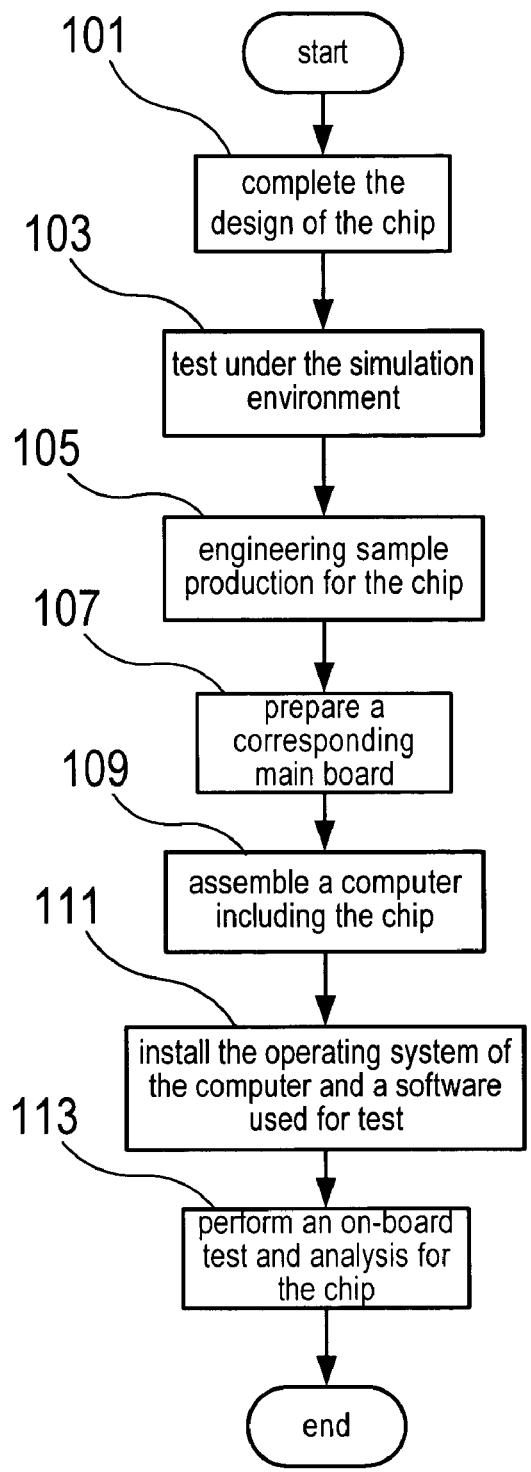
FIG. 1 is a flow chart of a conventional fabrication and test process for a chip.
Figure 2:
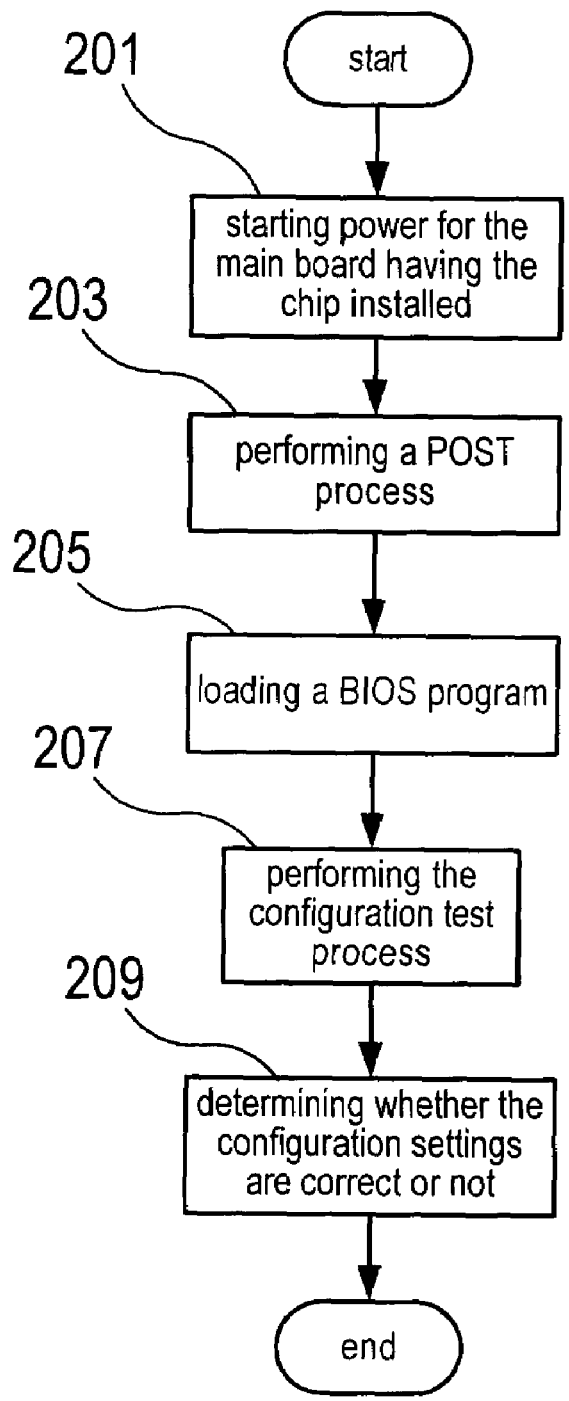
FIG. 2 is a flow chart of a preferred embodiment of the present invention.

First, referring to FIG. 2, a flow chart of a fabrication process for a chip according to a preferred embodiment of the present invention is shown. Conventionally, for the chip industry, it has always been assumed that, at the on board testing provided after the chip is fabricated completely, the configuration settings of the respective configuration registers in the configuration space of the chip are correct, the chip is then initialized for setting initial values, such that it becomes very difficult for testing the chip by other testing software after initialized. Even, the determining logics contradict such that the source of the error could not be concluded, due to base error produced by the initial values.

As illustrated in FIG. 2, a test method according to the present invention may comprise the steps as follows: first, starting power for the main board having the chip installed therein 201; after power is started, performing a power on self test (POST) process performed by the system 203; then, loading a basic input/output system (BIOS) program by the system 205, wherein the BIOS program may include a pre-written configuration test process; after the BIOS system is loaded, performing the configuration test process, testing each configuration setting for the chip 207; after tested, determining whether the configuration settings are correct or not depending on the tested result 209.

The configuration test process of the present invention could examine the actual reaction of the chip for analyzing it correctly, since the process is carried out just after the system is started and prior to the chip is initialized, without the need of initial values provided for the chip by the system via initialization.

Figure 3:
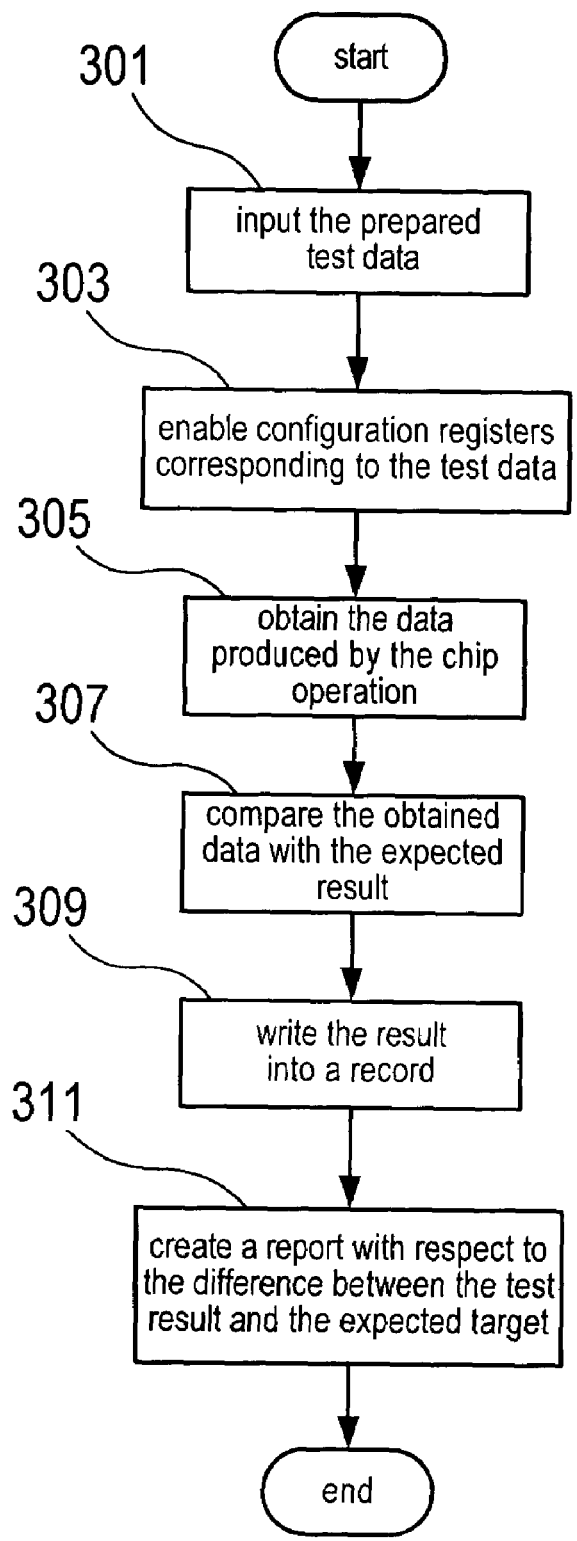
FIG. 3 is a flow chart of a configuration test process of the present invention.

Next, referring to FIG. 3, a flow chart of the configuration test process according to the present invention is shown. The configuration test process of the present invention, the procedure steps that are illustrated in the figure, may be written into the BIOS, and may be performed after the system is started and prior to the chip is initialized. First, inputting the prepared test data 301; enabling configuration registers corresponding to the configuration space of the chip depending on the need of the test data; and triggering the chip to perform corresponding operation 303; afterward, obtaining the data produced by the chip operation 305; comparing the obtained data with the expected result in accordance with the design specification for the chip 307; then, writing the correct comparison result and the difference between the result and the expected target into a record 309; creating a report with respect to the difference between the test result and the expected target, providing the industry with a basis for modifying the configuration space setting of the chip or serve as reference data for the development of a new generation product 311.

Figure 4:
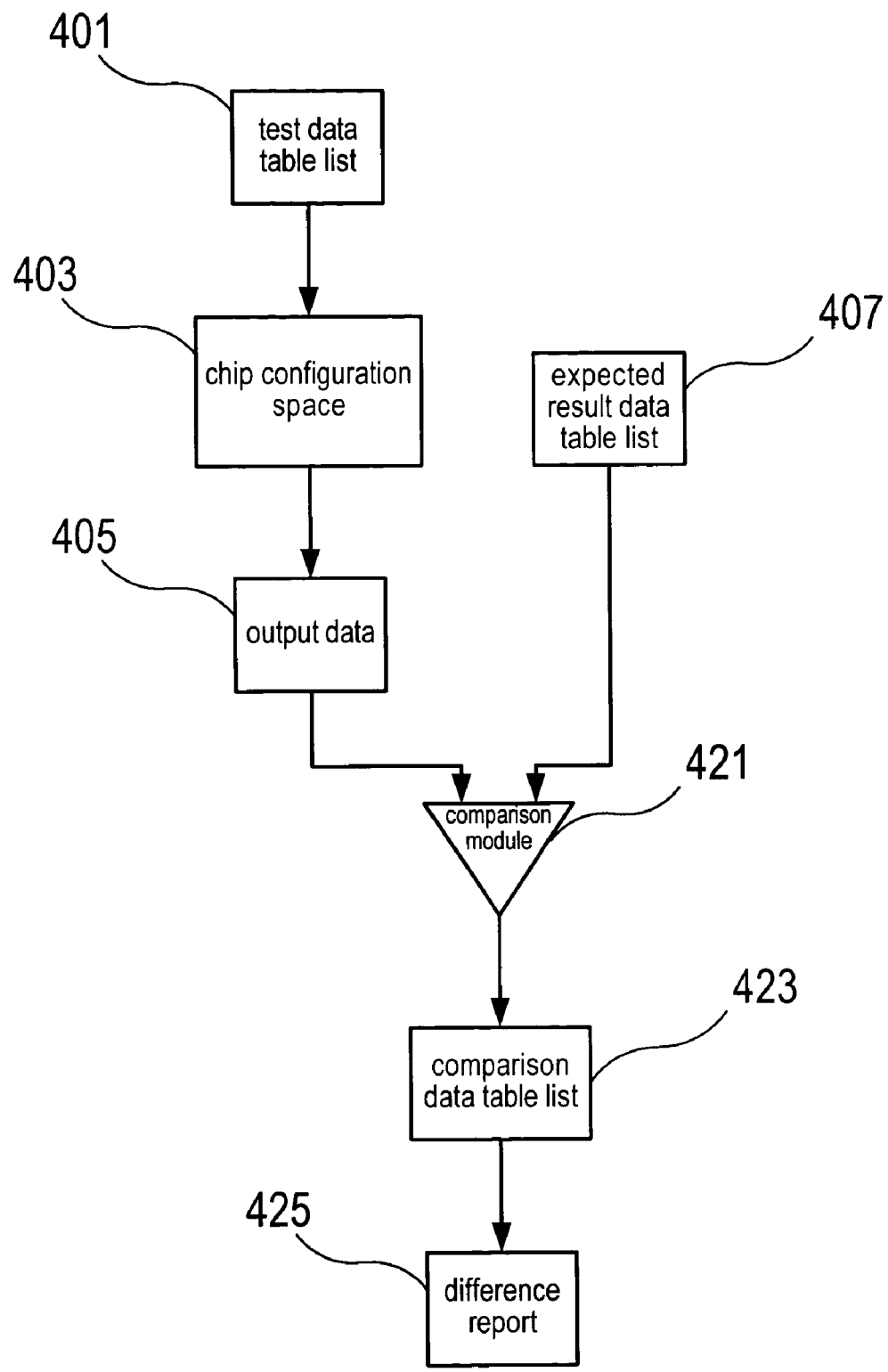
FIG. 4 is a diagrammatical view of a relationship between the respective modules in the test process of the present invention.

Finally, referring to FIG. 4, a diagrammatical view of a relationship between the respective modules in the test process according to the present invention is shown. As illustrated in the figure, a test data table list 401 including at least one set of test data, and an expected result data table list 407 ought to be obtained from an ideal chip based on the operation of the test data, that may be prepared by the industry in accordance with the design specifications for the chip. At least one set of output data 405 could be obtained from the chip based on the operation of respective test data, when the test data in the test data table list 401 is inputted into the configuration space 403. Then, the output data 405 as well as the corresponding expected result in the expected result data table list 407 are transmitted to a comparison module 421 to be compared with each other, and the result obtained from this comparison may be recorded in a comparison data table list 423. After that, a difference report 425, generated in accordance with said comparison result, may be provided as a basis for the modification of the chip configuration space as well as a reference for the development.

To sum up, it should be understood that the present invention is related to a method for testing a chip, particularly to a method for testing configuration settings of a chip, essentially provided to add a procedure for testing the configuration settings of the chip into the BIOS program, such that the verification for the configuration may be performed in the actual working environment as well as at the final stage before the operation is started. Thus, the correctness of the configuration settings could be found in the early phase, so as to speed the development and modification for the chip. Therefore, this application is filed in accordance with the patent law duly, since the present invention is truly an invention with novelty, advancement or non-obviousness, and availability by the industry, thus naturally satisfying the requirements of patentability. Your favorable consideration will be appreciated.

The foregoing description is merely one embodiment of present invention and not considered as restrictive. All equivalent variations and modifications in process, method, feature, and spirit in accordance with the appended claims may be made without in any way from the scope of the invention.

| LIST OF REFERENCE SYMBOLS | |
|---|---|
| 401 | test data table list |
| 403 | chip configuration space |
| 406 | output data |
| 407 | expected result data table list |
| 421 | comparison module |
| 423 | comparison data table list |
| 425 | difference report |

What is claimed is:

1. A method for testing configuration space settings of a chip, comprising the steps of:
    providing a main board including a chip to be tested, the chip having a configuration space defined therein;
    providing a BIOS program including a configuration space setting test process therein;
    starting power for said main board;
    performing a power-on self-test;
    loading said BIOS program; and
    executing said configuration space setting test process to verify correspondence of said configuration space defined in said chip to the configuration space settings of said chip.

2. The method according to claim 1, wherein said configuration test process included in said BIOS program comprises the steps of:
    providing a test datum;
    providing an expected result datum corresponding to said test datum;
    inputting said test datum into said BIOS;
    enabling a register corresponding to said chip configuration space depending on said test datum;
    triggering said chip to perform the corresponding operation;
    obtaining a result that is produced after operation of said chip; and
    comparing said obtained result datum with said expected result datum.

3. The method according to claim 2, further comprising the step of recording said comparison result.

4. The method according to claim 3, further comprising the step of generating a difference report.

5. The method according to claim 1, wherein said configuration test process included in said BIOS program comprises the steps of:
    providing at least one set of test data;

providing at least one set of expected result data corresponding to said test data;

inputting said test data;

enabling a register corresponding to said chip configuration space depending on said test data;

obtaining corresponding result data after operating of said chip in accordance with said test data; and comparing said obtained result data with said corresponding expected result data.

6. The method according to claim 5, wherein said test data is implemented in the form of a data table list.

7. The method according to claim 5, wherein said expected result data is implemented in the form of a data table list.

8. The method according to claim 5, further comprising the step of recording said comparison results.

9. The method according to claim 8, wherein said records of said comparison results are implemented in the form of a data table list.

10. The method according to claim 9, wherein each of said records of said comparison results includes a result and difference obtained from said comparison.

11. The method according to claim 10, further comprising the step of generating a difference report.

12. The method according to claim 5, further comprising the step of generating a test report.

* * * * *